(12) United States Patent
Kim

(10) Patent No.: US 9,500,962 B2
(45) Date of Patent: Nov. 22, 2016

(54) MASK CLAMPING APPARATUS AND METHOD OF MANUFACTURING MASK

(71) Applicant: Samsung Display Co., Ltd., Yongin, Gyeonggi-Do (KR)

(72) Inventor: Ho Eoun Kim, Hwaseong-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 207 days.

(21) Appl. No.: 14/172,013

(22) Filed: Feb. 4, 2014

(65) Prior Publication Data

US 2015/0009483 A1 Jan. 8, 2015

(30) Foreign Application Priority Data

Jul. 8, 2013 (KR) ........................ 10-2013-0079864

(51) Int. Cl.

| B05B 15/04 | (2006.01) |
|---|---|
| B05C 17/06 | (2006.01) |
| B05C 17/08 | (2006.01) |
| C23C 16/04 | (2006.01) |
| G03F 7/20 | (2006.01) |
| B05C 21/00 | (2006.01) |
| C23C 14/04 | (2006.01) |
| H01L 51/00 | (2006.01) |

(52) U.S. Cl.
CPC ............. *G03F 7/707* (2013.01); *B05B 15/045* (2013.01); *B05C 17/08* (2013.01); *B05C 21/005* (2013.01); *C23C 14/042* (2013.01); *C23C 16/042* (2013.01); *G03F 7/70783* (2013.01); *H01L 51/0011* (2013.01); *G03F 7/7075* (2013.01); *G03F 7/70691* (2013.01)

(58) Field of Classification Search
None
See application file for complete search history.

(56) References Cited

U.S. PATENT DOCUMENTS

| 4,391,511 | A | * | 7/1983 | Akiyama | ................. G03F 7/707 355/40 |
|---|---|---|---|---|---|
| 5,534,969 | A | * | 7/1996 | Miyake | ................... G03F 7/707 355/53 |
| 2006/0038973 | A1 | * | 2/2006 | Galburt | ................... G03F 7/707 355/75 |
| 2006/0148368 | A1 | * | 7/2006 | Kang | ..................... C23C 14/042 445/47 |
| 2009/0127236 | A1 | * | 5/2009 | Hong | ......................... G03F 7/12 219/121.64 |

(Continued)

FOREIGN PATENT DOCUMENTS

| KR | 1020060102093 A | 9/2006 |
|---|---|---|
| KR | 100794930 B1 | 1/2008 |
| KR | 1020080061496 A | 7/2008 |

*Primary Examiner* — Binu Thomas
(74) *Attorney, Agent, or Firm* — Cantor Colburn LLP

(57) ABSTRACT

A manufacturing method of a mask includes aligning a mask sheet including an effective area and a non-effective area, on a mask frame; applying a pressure to the non-effective area of the mask sheet in a direction opposite to a sagging direction of the non-effective area, to prevent sagging of the non-effective area; and moving a clamping unit to the mask sheet along a direction substantially parallel to the mask sheet, to clamp the clamping unit onto the non-effective area of the mask sheet.

5 Claims, 2 Drawing Sheets

(56) References Cited

U.S. PATENT DOCUMENTS

2010/0080891 A1* 4/2010 Yoshimura ............ C23C 14/042
　　　　　　　　　　　　　　　　　　　　　　118/500
2010/0192856 A1* 8/2010 Sung .................... C23C 14/042
　　　　　　　　　　　　　　　　　　　　　　118/721

* cited by examiner

MASK CLAMPING APPARATUS AND METHOD OF MANUFACTURING MASK

This application claims priority to Korean Patent Application No. 10-2013-0079864, filed on Jul. 8, 2013, and all the benefits accruing therefrom under 35 U.S.C. §119, the contents of which are hereby incorporated by reference in its entirety.

BACKGROUND

1. Field

The invention relates to a mask clamping apparatus and a method of manufacturing a mask. More particularly, the invention relates to a mask clamping apparatus used for deposition and exposure processes and a method of manufacturing the mask.

2. Description of the Related Art

An organic light emitting diode display includes an organic material that is self-emissive by using an electroluminescent phenomenon in which a fluorescent organic compound emits light when an electrical current is applied thereto. The organic light emitting diode display has been spotlighted for use in a next generation display device owing to advantages of slimness, lightweight, fast response speed, low driving voltage, high brightness, etc., when compared to a liquid crystal display.

In order to form an organic light emitting display panel, an organic material is deposited on an insulating substrate, on which a pixel definition layer is disposed, using a deposition mask. The deposition mask is formed by attaching a mask sheet on a mask frame and removing a surplus portion of the mask sheet. When the mask sheet has a size larger than that of the mask frame, the surplus portion of the mask sheet, which is not supported by the mask frame, is sagged downwardly.

SUMMARY

One or more embodiment of the invention provides a mask clamping apparatus capable of reducing or effectively preventing sagging of a non-effectively area of a mask sheet and allowing clamping of the mask sheet by movement of a clamp in a direction parallel to the mask sheet without movement in an up and down direction.

One or more exemplary embodiment of the invention provides a method of manufacturing a mask.

An exemplary embodiment of the invention provides a mask clamping unit including a clamping unit and a sagging prevention unit.

The clamping unit clamps a non-effective area of a mask sheet including an effective area and the non-effective area. The sagging prevention unit is configured to apply a force to the non-effective area of the mask sheet in a direction opposite to a sagging direction of the non-effective area, and prevents sagging of the non-effective area of the mask sheet.

According to an exemplary embodiment, the sagging prevention unit is disposed under the non-effective area and sprays a gas from a lower portion to an upper portion toward the non-effective area, to apply the force to the non-effective area of the mask sheet.

According to an exemplary embodiment, the sagging prevention unit is disposed on the non-effective area and draws a gas from a lower portion to an upper portion away from the non-effectively area, to apply the force to the non-effective area of the mask sheet.

Another exemplary embodiment of the invention provides a manufacturing method of a mask including aligning a mask sheet including an effective area and a non-effective area, on a mask frame; applying a pressure to the non-effective area of the mask sheet in a direction opposite to a sagging direction of the non-effective area, to prevent sagging of the non-effective area; and moving a clamping unit to the mask sheet along a direction substantially parallel to the mask sheet, to clamp the clamping unit onto the non-effective area of the mask sheet.

The applying the pressure to the non-effective area of the mask sheet includes a sagging prevention unit under the non-effective area and spraying a gas from a lower portion to an upper portion toward the non-effective area of the mask sheet.

The applying the pressure to the non-effective area of the mask sheet includes a sagging prevention unit on the non-effective area and drawing a gas from a lower portion to an upper portion away from the non-effective area of the mask sheet.

According to one or more exemplary embodiment of the invention, the effective area and the non-effective area of the mask sheet may be maintained coplanar with each other. Thus, the clamping unit may clamp the mask sheet while being moved only in a direction parallel to the mask sheet without being moved an up and down direction perpendicular to the plane of the mask sheet.

BRIEF DESCRIPTION OF THE DRAWINGS

The above and other advantages of the invention will become readily apparent by reference to the following detailed description when considered in conjunction with the accompanying drawings wherein.

DETAILED DESCRIPTION

Figure 1:
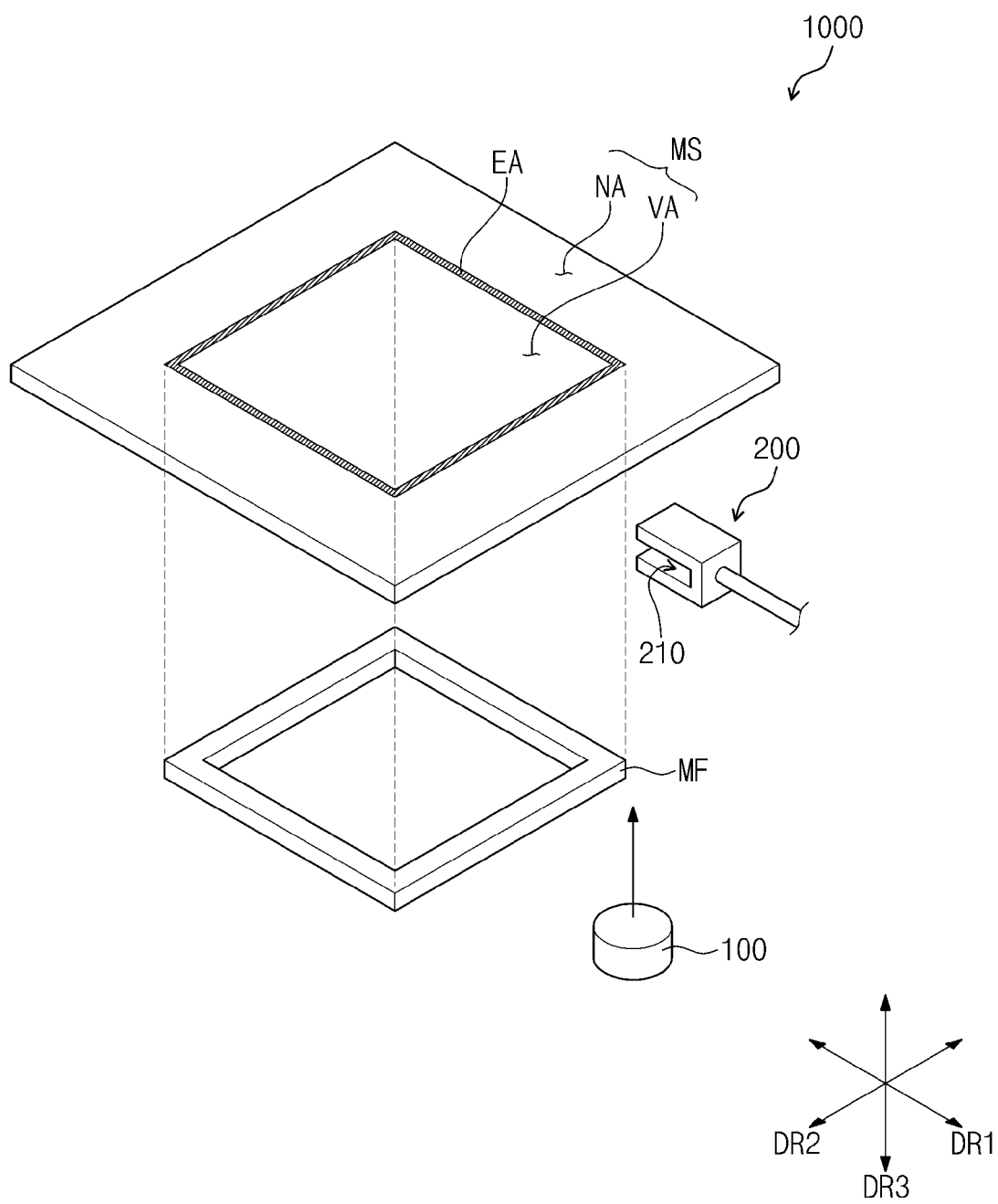
FIG. 1 is an exploded perspective view showing an exemplary embodiment of a mask clamping apparatus according to the invention.

It will be understood that when an element or layer is referred to as being "on" or "attached to" another element or layer, it can be directly on or attached to the other element or layer or intervening elements or layers may be present. In contrast, when an element is referred to as being "directly on" or "directly attached to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "above," "upper," "under" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "lower" or "under" other elements or features would then be oriented "above" the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the invention will be explained in detail with reference to the accompanying drawings.

In the following description, a deposition mask used for a deposition apparatus of a flat panel display will be described as a representative example, but the invention should not be limited thereto or thereby. A manufacturing method of a mask according to the invention may be applied to manufacture various masks, e.g., a deposition mask used for a deposition process of a semiconductor device, a photomask used for a photolithography process of the flat panel display or the semiconductor device.

The deposition mask may be applied to the deposition process of positive and negative electrodes and an organic light emitting layer of an organic electroluminescent display or to the deposition process used to form a pattern on a semiconductor wafer using a heat deposition method or an e-beam deposition method.

The photomask may be applied to transfer a pattern in an exposure process used to form a thin film transistor or a pixel electrode of a liquid crystal display or to transfer a pattern in an exposure process when the semiconductor device is manufactured.

Hereinafter, exemplary embodiments of a mask clamping apparatus and a manufacturing method a mask using the same will be described.

Figure 2:
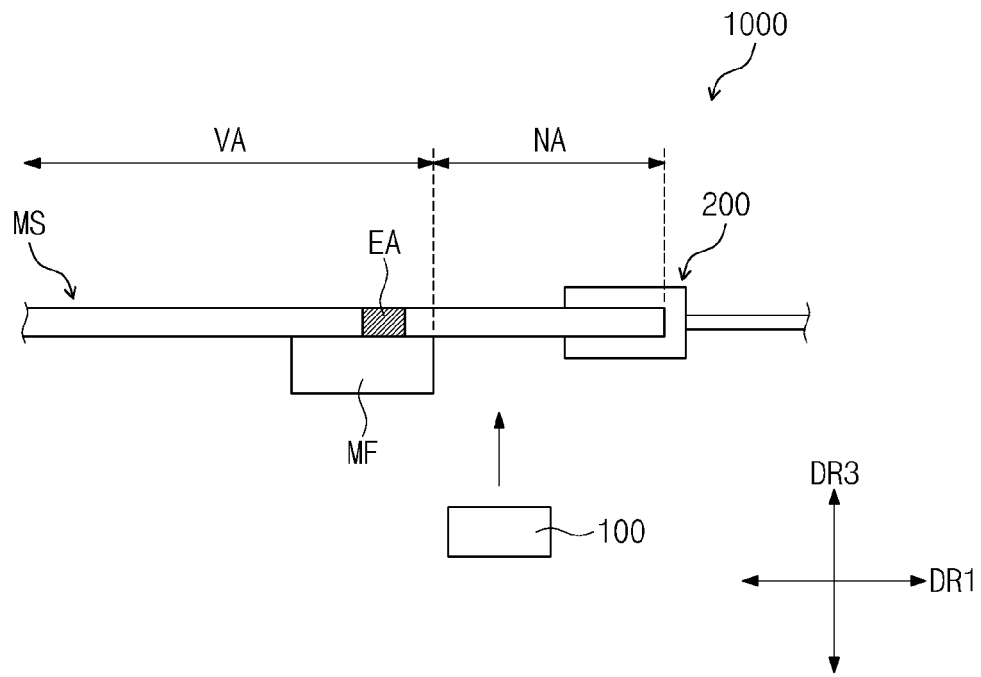
FIG. 2 is a cross-sectional side view showing the mask clamping apparatus shown in FIG. 1.

FIG. 1 is an exploded perspective view showing an exemplary embodiment of a mask clamping apparatus 1000 according to the invention and FIG. 2 is a cross-sectional side view showing the mask clamping apparatus 1000 shown in FIG. 1.

Referring to FIGS. 1 and 2, the mask clamping apparatus 1000 includes a clamping unit 200 and a sagging prevention unit 100. Each element will be described in detail in an exemplary embodiment of a process flow.

A mask sheet MS is prepared. The mask sheet MS has a flat plate shape in a first direction DR1, and a second direction DR2 substantially perpendicular to the first direction DR1. The mask sheet MS includes an effective area VA, and a non-effective area NA that surrounds the effective area VA. The effective area VA of the mask sheet MS serves as a mask after the mask is manufactured, and the non-effective area NA is removed from the mask sheet MS. The mask sheet MS has a cross-sectional thickness from about 40 micrometers to about 80 micrometers.

The mask sheet MS is aligned on a mask frame MF. The mask frame MF is disposed under the mask sheet MS in a third direction DR3 substantially perpendicular to the first and second directions DR1 and DR2. The mask frame MF supports the mask sheet MS to reduce or effectively prevent sagging of the mask sheet MS. The mask frame MF is provided with an opening extended therethrough, and thus the mask frame MF has a rectangular ring shape.

An edge of the effective area VA is supported by an upper surface of the mask frame MF. In contrast, the non-effective area NA is not supported by the upper surface of the mask frame MF and extends further from and is exposed by the mask frame MF. Since a cross-sectional thickness of the mask sheet MS is relatively small, the non-effective area NA may sag due to gravity.

The sagging prevention unit 100 reduces or effectively prevents sagging of the non-effective area NA. The sagging prevention unit 100 is disposed under the non-effective area NA in the third direction DR3. The sagging prevention unit 100 may remain separated from the mask sheet MS during attachment of the mask sheet MS to the mask frame MF, but the invention is not limited thereto or thereby. The sagging prevention unit 100 is configured to apply a force to the non-effective area NA of the mask sheet MS, such as by spraying gas in a direction opposite to gravity, e.g., a direction from the lower portion of the mask sheet MS to the upper portion of the mask sheet MS or from bottom to top in the view of FIG. 2, as indicated by the upward pointing arrow in FIG. 2. The gas may be air, but should not be limited thereto.

Due to the sagging prevention unit 100, the force from a pressure is applied to a lower surface of the non-effective area NA of the mask sheet MS in the direction from the lower portion to the upper portion, and thus sagging of the non-effective area NA of the mask sheet MS may be reduced or effectively prevented. The speed and amount of the gas sprayed from the sagging prevention unit 100 may be controlled. That is, the effective area VA and the non-effective area NA of the mask sheet MS are maintained in the flat state (e.g., coplanar) with respect to the first and second directions DR1 and DR2 by the sagging prevention unit 100.

While only one sagging prevention unit 100 has been shown in FIG. 1, a number of the sagging prevention unit 100 provided in the mask clamping apparatus 1000 should not be limited thereto or thereby. That is, the sagging prevention unit 100 may be provided in a plural number to be disposed under the non-effective area NA of the mask sheet MS.

The clamping unit 200 is configured to move toward the mask sheet MS along the first direction DR1 to clamp the mask sheet MS. A recess 210 is defined in the clamping unit 200 corresponding to the cross-sectional thickness of the mask sheet MS, and has a substantially C-shape in a cross-sectional view. The clamping unit 200 clamps onto the non-effective area NA when the clamping unit 200 clamps the mask sheet MS, such that a flatness of the effective area VA and the non-effective area NA is maintained. The moving of the clamping unit 200 and/or the clamping of the clamping unit 200 to the mask sheet MS may be performed at a same time or a different time at which the sagging prevention unit 100 applies the pressure.

When the mask clamping apparatus 1000 does not employ the sagging prevention unit 100, the non-effective area NA sags. When the non-effective area NA sags, the clamping unit 200 is required to move not only in the first direction DR1 but also in the third direction DR3 in order to clamp only the sagged non-effective area NA of the mask sheet MS. When the clamping unit 200 moves in the third direction DR3, maintaining the flatness of the mask sheet MS is difficult even though the clamping unit 200 clamps the mask sheet MS. In the illustrated exemplary embodiment, however, since the sagging prevention unit 100 supports the non-effective area NA to allow the non-effective area NA not to sag, the clamping unit 200 may move in the first direction DR1 to clamp onto the mask sheet MS. Consequently, the flatness of the mask sheet MS may be maintained.

Then, the clamping unit 200 moves in reverse and away from the mask sheet MS in order to expand the mask sheet MS while the clamping unit 200 is clamped to the mask sheet MS. When the mask sheet MS is expanded to a desired size, the mask sheet MS is then attached to the mask frame MF. In expanding the mask sheet MS to the desired size, the edge EA of the effective area VA of the mask sheet MS is attached to the mask frame MF. To this end, a joining unit such as including a laser beam is irradiated to the edge EA of the effective area VA by a laser irradiator (not shown) disposed on the mask sheet MS, and thus the edge EA of the effective area VA of the mask sheet MS is welded to the mask frame MF. The method of attaching the mask sheet MS to the mask frame MF, however, should not be limited thereto or thereby.

Once the mask sheet MS is attached to the mask frame MF, the clamping unit 200 is unclamped from the mask sheet MS, and the non-effective area NA of the mask sheet MS is separated from a remainder of the mask sheet MS using various tools, e.g., a knife, a cutter, etc.

Hereinafter, another exemplary embodiment of a mask clamping unit according to the invention will be described.

Figure 3:
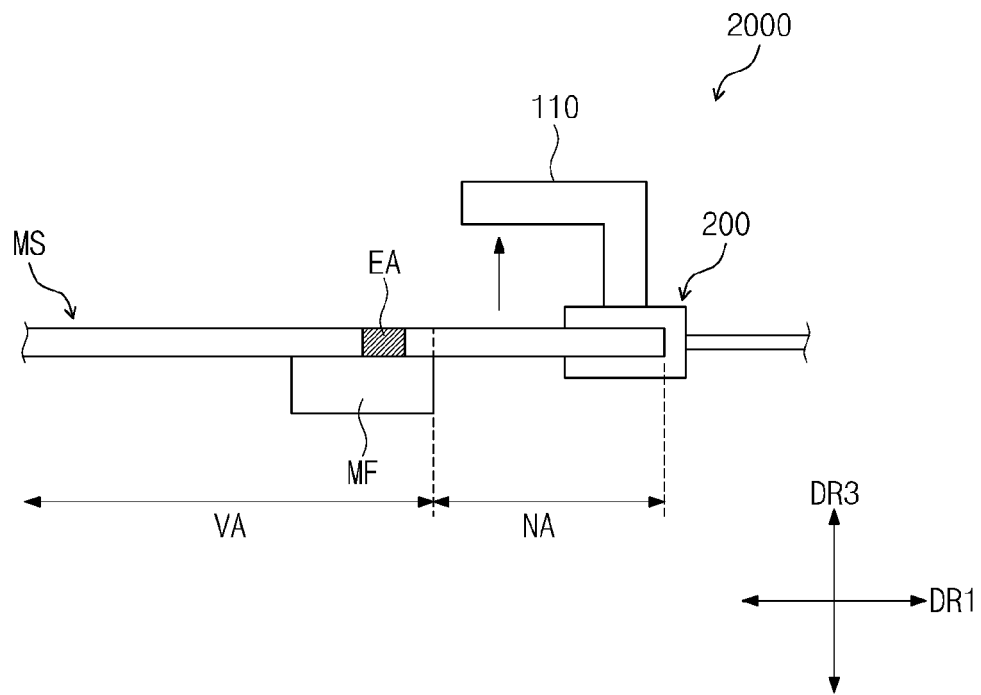
FIG. 3 is a cross-sectional side view showing another exemplary embodiment of a mask clamping apparatus according to the invention.

FIG. 3 is a cross-sectional side view showing another exemplary embodiment of a mask clamping apparatus according to the invention. In FIG. 3, the same reference numerals denote the same elements in FIGS. 1 and 2, and thus detailed descriptions of the same elements will be omitted.

A mask clamping apparatus 2000 has the same structure and function as the mask clamping apparatus 100 except for a sagging prevention unit 110. Thus, hereinafter the sagging prevention unit 110 will be mainly described.

The sagging prevention unit 110 is disposed on the non-effective area NA in the third direction DR3. The sagging prevention unit 110 is configured to apply a force to the non-effective area NA of the mask sheet MS, such as by drawing gas, e.g., air, from the lower portion to the upper portion, i.e., the third direction DR3, as indicated by the upward pointing arrow in FIG. 3. Due to the sagging prevention unit 110, the force from a pressure is applied to the upper surface of the non-effective area NA such that the non-effective area NA of the mask sheet MS is attracted to the sagging prevention unit 110, thereby reducing or effectively preventing sagging of the non-effective area NA of the mask sheet MS. The speed and amount of the gas drawn by the sagging prevention unit 110 may be controlled. That is, the effective area VA and the non-effective area NA of the mask sheet MS are maintained in the flat state with respect to the first and second directions DR1 and DR2 by the sagging prevention unit 110.

As illustrated in FIG. 3, the sagging prevention unit 110 may be attached to the clamping unit 200. In detail, the sagging prevention unit 110 is attached on an upper portion of the clamping unit 200 and extended in the first direction DR1. An extended portion of the sagging prevention unit 100 overlaps the non-effective area NA of the mask sheet MS.

Similar to the previous exemplary embodiment, since the sagging prevention unit 110 supports the non-effective area NA to allow the non-effective area NA not to sag, the clamping unit 200 may move in the first direction DR1 to clamp onto the mask sheet MS. Consequently, the flatness of the mask sheet MS may be maintained.

Although exemplary embodiments of the invention have been described, it is understood that the invention should not be limited to these exemplary embodiments but various changes and modifications can be made by one ordinary skilled in the art within the spirit and scope of the invention as hereinafter claimed.

What is claimed is:

1. A mask clamping unit comprising:
    a clamping unit which clamps a non-effective area of a mask sheet comprising:
        an effective area disposed in a plane defined in first and second directions, and
        the non-effective area which extends from the effective area; and
    a sagging prevention unit which is spaced apart from the non-effective area of the mask sheet and configured to apply a force to the non-effective area of the mask sheet in a direction opposite to a sagging direction of the non-effective area, and prevents sagging of the non-effective area of the mask sheet, the sagging direction defined in a third direction perpendicular to the plane defined in the first and second directions,
    wherein
    the effective area of the mask sheet is supported by a mask frame which disposed in the effective area, and the non-effective area is not supported by the mask frame, and
    the sagging prevention unit spaced apart from the non-effective area of the mask sheet overlaps the non-effective area in the sagging direction, and sprays a gas in a direction opposite to the sagging direction and toward the non-effective area, to apply the force to the non-effective area of the mask sheet.

2. The mask clamping unit of claim 1, wherein the sagging prevention unit maintains the effective area and the non-effective substantially coplanar with each other.

3. The mask clamping unit of claim 1, wherein the clamping unit is configured to move in a direction substantially parallel to the mask sheet.

4. A mask clamping unit comprising:
a clamping unit which clamps a non-effective area of a mask sheet comprising:
an effective area disposed in a plane defined in first and second directions, and
the non-effective area which extends from the effective area; and
a sagging prevention unit which is spaced apart from the non-effective area of the mask sheet and configured to apply a force to the non-effective area of the mask sheet in a direction opposite to a sagging direction of the non-effective area, and prevents sagging of the non-effective area of the mask sheet, the sagging direction defined in a third direction perpendicular to the plane defined in the first and second directions,
wherein
the effective area of the mask sheet is supported by a mask frame which disposed in the effective area, and the non-effective area is not supported by the mask frame, and
the sagging prevention unit spaced apart from the non-effective area of the mask sheet overlaps the non-effective area in a direction opposite to the sagging direction, and draws a gas from the non-effective area and in the direction opposite to the sagging direction, to apply the force to the non-effective area of the mask sheet.

5. The mask clamping unit of claim 4, wherein the sagging prevention unit is attached to the clamping unit.

* * * * *